US008147962B2

(12) United States Patent
Hsu et al.

(10) Patent No.: US 8,147,962 B2
(45) Date of Patent: Apr. 3, 2012

(54) CONDUCTIVE POLYMER COMPOSITES

(75) Inventors: Che-Hsiung Hsu, Wilmington, DE (US); Christopher P. Junk, Wilmington, DE (US); Sunghan Kim, Goleta, CA (US); Daniel David Lecloux, Buellton, CA (US); Ralph Birchard Lloyd, Fayetteville, NC (US); Shiva Prakash, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 295 days.

(21) Appl. No.: 10/823,311

(22) Filed: Apr. 13, 2004

(65) Prior Publication Data
US 2005/0227081 A1   Oct. 13, 2005

(51) Int. Cl.
B32B 9/00       (2006.01)
H01L 51/00      (2006.01)
H01L 51/54      (2006.01)

(52) U.S. Cl. ............ 428/411.1; 428/704; 428/917; 313/506; 257/40

(58) Field of Classification Search .......... None
See application file for complete search history.

(56) References Cited

U.S. PATENT DOCUMENTS

| | | | |
|---|---|---|---|
| 3,282,875 A | 11/1966 | James et al. | |
| 4,358,545 A | 11/1982 | Ezzell et al. | |
| 4,433,082 A | 2/1984 | Grot | |
| 4,552,927 A | 11/1985 | Warren | |
| 4,731,408 A | 3/1988 | Jasne | |
| 4,795,543 A | 1/1989 | Stetter et al. | |
| 4,869,979 A * | 9/1989 | Ohtani et al. | 429/213 |
| 4,940,525 A | 7/1990 | Ezzell et al. | |
| 4,959,430 A | 9/1990 | Jonas et al. | |
| 5,002,700 A | 3/1991 | Otagawa et al. | |
| 5,069,820 A | 12/1991 | Jen et al. | |
| 5,160,457 A | 11/1992 | Elsenbaumer | |
| 5,185,100 A | 2/1993 | Han et al. | 252/500 |
| 5,247,190 A | 9/1993 | Friend et al. | |
| 5,286,413 A | 2/1994 | Hannecart et al. | |
| 5,300,575 A | 4/1994 | Jonas et al. | |
| 5,317,169 A | 5/1994 | Nakano et al. | |
| 5,378,402 A | 1/1995 | Cross et al. | |
| 5,463,005 A | 10/1995 | Desmarteau | |
| 5,705,888 A | 1/1998 | Staring et al. | |
| 5,798,170 A | 8/1998 | Zhang et al. | |
| 5,986,400 A | 11/1999 | Staring et al. | |
| 6,150,426 A | 11/2000 | Curtin et al. | |
| 6,210,790 B1 | 4/2001 | Crivello | |
| 6,303,238 B1 | 10/2001 | Thompson et al. | |
| 6,319,428 B1 | 11/2001 | Michot et al. | |
| 6,324,091 B1 * | 11/2001 | Gryko et al. | 365/151 |
| 6,337,370 B1 | 1/2002 | Bae et al. | |
| 6,670,645 B2 | 12/2003 | Grushin et al. | |
| 6,706,963 B2 | 3/2004 | Gaudiana et al. | |
| 6,717,358 B1 | 4/2004 | Liao et al. | |
| 7,112,369 B2 | 9/2006 | Wang et al. | |
| 7,166,010 B2 | 1/2007 | Lamansky et al. | |
| 7,189,771 B2 | 3/2007 | Hsu | |
| 7,244,797 B2 | 7/2007 | Kurihara et al. | |
| 7,250,461 B2 | 7/2007 | Hsu et al. | |
| 7,317,047 B2 | 1/2008 | Hsu | |
| 7,338,620 B2 | 3/2008 | Hsu et al. | |
| 7,354,532 B2 | 4/2008 | Hsu et al. | |
| 7,390,438 B2 | 6/2008 | Hsu et al. | |
| 7,431,866 B2 | 10/2008 | Hsu et al. | |
| 7,455,793 B2 | 11/2008 | Hsu et al. | |
| 7,569,158 B2 | 8/2009 | Waller et al. | |
| 7,749,407 B2 | 7/2010 | Hsu et al. | |
| 2001/0019782 A1 | 9/2001 | Igarashi et al. | |
| 2001/0038937 A1 | 11/2001 | Suzuki et al. | |
| 2003/0020073 A1 | 1/2003 | Long et al. | |
| 2003/0052310 A1 | 3/2003 | Michot et al. | |
| 2003/0118829 A1 | 6/2003 | Hsu | |
| 2004/0009346 A1 | 1/2004 | Jang et al. | |
| 2004/0102577 A1 * | 5/2004 | Hsu et al. | 525/182 |
| 2004/0127637 A1 | 7/2004 | Hsu et al. | |
| 2004/0149952 A1 | 8/2004 | DePenning et al. | |
| 2004/0149962 A1 | 8/2004 | Andriessen | |
| 2004/0206942 A1 | 10/2004 | Hsu | |
| 2004/0217877 A1 * | 11/2004 | Kokonaski et al. | 340/815.4 |
| 2004/0254297 A1 | 12/2004 | Hsu et al. | |
| 2005/0070654 A1 | 3/2005 | Hsu | |
| 2005/0205860 A1 | 9/2005 | Hsu et al. | |
| 2005/0208328 A1 | 9/2005 | Hsu et al. | |
| 2005/0209388 A1 | 9/2005 | Hsu et al. | |
| 2005/0209392 A1 | 9/2005 | Luo et al. | |
| 2005/0222333 A1 | 10/2005 | Hsu | |
| 2005/0224765 A1 | 10/2005 | Hsu et al. | |
| 2005/0224788 A1 | 10/2005 | Hsu et al. | |
| 2006/0113510 A1 | 6/2006 | Luo et al. | |
| 2006/0289843 A1 | 12/2006 | Hsu et al. | |
| 2006/0292362 A1 | 12/2006 | Hsu et al. | |
| 2007/0045591 A1 | 3/2007 | Hsu et al. | |
| 2007/0096082 A1 | 5/2007 | Gaynor et al. | |
| 2008/0135809 A1 | 6/2008 | Hsu | |
| 2008/0213594 A1 | 9/2008 | Hsu | |
| 2008/0248314 A1 | 10/2008 | Hsu et al. | |
| 2008/0251768 A1 | 10/2008 | Hsu et al. | |
| 2008/0258605 A1 | 10/2008 | Yukinobu | |
| 2008/0283800 A1 | 11/2008 | Hsu | |
| 2008/0296536 A1 | 12/2008 | Hsu et al. | |
| 2009/0008609 A1 | 1/2009 | Yeisley et al. | |

FOREIGN PATENT DOCUMENTS

DE           4334390 C2    1/1999
(Continued)

OTHER PUBLICATIONS

U.S. Appl. No. 60/457,115, filed Mar. 2003.* U.S. Appl. No. 60/460,353, filed Apr. 2003.*
Hsu, C. -H., Novel Preparation and Properties of Conductive Polyaniline/Nafion Film, Synthetic Metals, 1991, 671-674, 41-43, Elsevier Sequoia, The Netherlands.
S.A. Arnautov, S.V. Zaitsev-Zotov, V.M. Kobryansnkii: "New Dopant-Solvent System for Conductive PAN Films Production" in Synthetic Metals vol. 84, No. 1-3, 1997, pp. 133-134, Elsevier Science S.A.
W. Chen, Z.-X. Dong, T.-J. Huang, D. Su, J.M. Shreeve, "1,1,2,2-Tetra-fluoro-2-(polyflouroalkoxy)ethanesulfonic Acids . . . and 2,2'-oxybis(1,1,2,2-tetrafluoroethanesulfonic acid)" in Inorganic Chemistry, vol. 27, 1988, pp. 1376-1377, American Chemical Society.

(Continued)

Primary Examiner — Marie R. Yamnitzky

(57) ABSTRACT

The invention relates to conductive polymer composites comprising a first layer comprising at least one electrically doped conductive polymer and a second layer comprising at least one material selected from a colloid-forming polymeric acid, a salt of a colloid-forming polymeric acid, a non-polymeric fluorinated organic acid, and a salt of a non-polymeric fluorinated organic acid.

16 Claims, 1 Drawing Sheet

FOREIGN PATENT DOCUMENTS

| | | | |
|---|---|---|---|
| EP | 560721 | A2 | 9/1993 |
| EP | 440957 | B1 | 3/1996 |
| EP | 817540 | A2 | 1/1998 |
| EP | 593111 | B1 | 6/1998 |
| EP | 1026152 | B1 | 7/2006 |
| EP | 1286569 | B1 | 6/2007 |
| EP | 1371709 | B1 | 7/2008 |
| EP | 1191614 | B1 | 5/2009 |
| EP | 1191612 | B1 | 9/2009 |
| EP | 1408563 | B1 | 7/2010 |
| GB | 2124635 | A | 7/1984 |
| JP | 62119237 | A1 | 5/1987 |
| JP | 1038808 | | 8/1989 |
| JP | 2249221 | A2 | 10/1990 |
| JP | 2003217862 | A | 7/2003 |
| JP | 2004082395 | A | 3/2004 |
| WO | 9831716 | A1 | 7/1998 |
| WO | 9952954 | A1 | 10/1999 |
| WO | 0070655 | A3 | 11/2000 |
| WO | 0141512 | A1 | 6/2001 |
| WO | 0202714 | A2 | 1/2002 |
| WO | 0215645 | A1 | 2/2002 |
| WO | WO 02/065484 | A1 | 8/2002 |
| WO | 03006515 | A1 | 1/2003 |
| WO | 03006537 | A1 | 1/2003 |
| WO | 03008424 | A1 | 1/2003 |
| WO | 03040257 | A1 | 5/2003 |
| WO | WO 03/046540 | A1 | 6/2003 |
| WO | 03063555 | A1 | 7/2003 |
| WO | 03074601 | A2 | 9/2003 |
| WO | 03091688 | A2 | 11/2003 |
| WO | 2004016710 | A1 | 2/2004 |
| WO | 2004020444 | A1 | 3/2004 |
| WO | 2004029128 | A2 | 4/2004 |
| WO | 2004029133 | A1 | 4/2004 |
| WO | WO 2004/029176 | A1 | 4/2004 |
| WO | 2004094501 | A2 | 11/2004 |
| WO | 2004105150 | A1 | 12/2004 |
| WO | 2005003083 | A1 | 1/2005 |
| WO | 2005024853 | A1 | 3/2005 |
| WO | 2005080525 | A2 | 9/2005 |
| WO | 2005121217 | A1 | 12/2005 |
| WO | 2006073968 | A2 | 7/2006 |
| WO | 2007002682 | A2 | 1/2007 |
| WO | 2007002737 | A2 | 1/2007 |
| WO | 2007092296 | A2 | 8/2007 |
| WO | 2007120143 | A1 | 10/2007 |

OTHER PUBLICATIONS

Database CA Online, Chemical Abstracts Service, Kaoru Iwata et al., "Dopants for Electrically Conductive Polymers" Database Accession No. 1988:7040, American Chemical Society, Columbus, Ohio, May 30, 1987.

T. Hirai et al., "Electrochemical Behaviors of Polypyrrole, Poly-3-Methyl-thiophene, and Polyaniline Deposited on Nafion-Coated Electrodes" in Journal of the Electrochemical Society, vol. 135, No. 5, May 1, 1988, pp. 1132-1137, Electrochemical Society, Manchester, New Hampshire.

Database CA Online, Chemical Abstracts Service, Takeshi Morimoto et al., "Solid Electrolytic Capacitor Having Electrically Conductive Polymer on Dielectric Oxide Film" Database Accession No. 1991:113460, American Chemical Society, Columbus, Ohio, Oct. 5, 1990.

A. Kitani, K. Yoshioka, S. Maitani, S. Ito, "Properties of Elastic Polyaniline" in Synthetic Metals, vol: 84, No. 1-3, 1997, pp. 83-84, Elsevier Science S.A.

Appleby et al.,—Polymeric Perfluoro Bis-Sulfonimides As Possible Fuel Cell Electrolytes, J. Electrochem. Soc., 1993 vol. 140 pp. 109-111.

Baytron H. C. Stark GMBH (Brochure) No Date.

Brown et al,—Built-in field electroabsorption spectroscopy of polymer light-emitting diodes incorporating a doped poly (3,4-ethylene dioxythiophene) hole injection layer, Applied Physics Letters, AIP, American Institute of Physics, vol. 75, No. 12, pp. 1679-1681, Sep. 20, 1999.

Desmarteau—Novel Perfluorinated Ionomers and Ionenes, J. Fluorine Chem., 1995 vol. 72 pp. 203-208.

Downs C et al.,—Efficient Polymerization of Aniline at Carbon Nanotube Electrodes, Advanced Materials, vol. 11, No. 12, pp. 1028-1031, Aug. 1999.

Feiring et al.,—Aromatic Monomers With Pendant Fluoroalkylsulfonate and Sulfonimide Groups, J Fluorine Chemistry, 2000 vol. 105 pp. 129-135.

Feiring et al.,—Novel Aromatic Polymers With Pendant Lithium Perfluoroalkylsulfonate or Sulfonimide Groups, Macromolecules 2000 vol. 33 pp. 9262-9271.

Fowler J D et al.,—Hydrogen detection by Polyaniline nanofibers on gold and platinum electrodes, The Journal of Physical Chemistry C, vol. 113, No. 16, pp. 6444-6449, 2009 (published on Web Mar. 26, 2009).

Gustafsson et al.—Flexible Light-Emitting Diodes Made From Soluble Conducting Polymers, Nature 1992 vol. 357 pp. 477-479.

Iijima et al.—Single-Shell Carbon Nanotubes of 1-nm Diameter, Nature, 1993 vol. 363 pp. 603-605.

Ivanov et al, The Study of Carbon Nanotubules Produced by Catalytic Method, Chem. Phys. Lett. 1994, vol. 223 pp. 329-335.

Journet et al.,—Large-Scale Production of Single-Walled Carbon Nanotubes by the Electric-Arc Technique, Nature, 1997 vol. 388 pp. 756-758.

Kim et al, Enhancement of Electrical Conductivity of Poly(3,4-ethylenedioxythiophene)/Poly(4-styrenesulfonate) by a Change of Solvents, Synthetic Metals, Elsevier Sequoia, vol. 126, No. 2/3, pp. 311-316, Feb. 2002.

Lee et al, Poly(thieno(3,4-b)thiophene) A New Stable Low Band Gap Conducting Polymer, Macromolecules 2001 vol. 34 pp. 5746-5747.

Li et al—Large-Scale Synthesis of Aligned Carbon Nanotubes, Science, 1996 vol. 274 pp. 1701-1703.

Sharpe et al—Improved Cationic Conductive Polymer, Calgon Corp, Coating Conference (Proceeding) 1981 pp. 83-87.

Sotzing et al—Poly(thieno(3,4-b)thiophene): A p- and n-dopable Polythiophene Exhibiting High Optical Transparency in the Semiconducting State, Macromolecules, 2002 vol. 35 pp. 7281-7286.

Thess et al., Crystalline Ropes of Metallic Carbon Nanotubes, Science, 1996 vol. 273 pp. 483-487.

Wang—Photoconductive Materials, Kirk-Othmer Encyclopedia of Chemical Technology, Fourth Edition, 1996, vol. 18 pp. 837-860.

Wu et al, Transparent, Conductive Carbon Nanotube Films, Science, 2004, vol. 305, pp. 1273-1276.

Yang S-M et al.,—The photoelectrochemical properties of TiO2 electrodes modified by quantum sized PbS and thiols, Synthetic Metals, vol. 123, No. 2, pp. 267-272, Sep. 4, 2001.

Yuan Y F et al,—Size and morphology effects of ZnO anode nanomaterials for Zn/Ni secondary batteries, Nanotechnology, vol. 16, No. 6, pp. 803-808, Apr. 11, 2005.

Extended European Search Report for Application No. EP 06785720.1, Jul. 9, 2009.

Extended European Search Report for Application No. EP 07763641.3, Nov. 30, 2010.

Extended European Search Report for Application No. EP 06 774 171, Jun. 21, 2011.

Written Opinion of the International Search Authority; PCT/US2006/25128; Lee W. Young, Authorized Officer; United States Patent and Trademark Office as International Searching Authority, Feb. 2, 2007.

PCT International Search Report for International Application No. PCT/US2005012460; C. Meiners Authorized Officer, Aug. 2, 2005.

PCT International Search Report for International Application No. PCT/US 05/008764; F. Rousseau, Authorized Officer; Aug. 3, 2005.

PCT International Search Report for Application No. PCT/US2006/014551; Rena L. Dye, Authorized Officer; Feb. 1, 2007.

PCT International Search Report for International Application No. PCT/US06/25129; Elizabeth Robinson Authorized Officer Feb. 6, 2008.

PCT International Search Report for International Application No. PCT/US07/02858; Blaine R. Copenheaver Authorized Officer, Apr. 7, 2008.

PCT International Search Report for International Application No. PCT/US08/88089; Lee W. Young Authorized Officer Feb. 18, 2009.
Written Opinion of the International Searching Authority, WO 2005/100473, PCT/US2005/012460, PCT counterpart of the present application, C. Meiners, which is being submitted as an NPL document, dated Jul. 29, 2005.

Extended European Search Report for Application No. 11006587.7; Sep. 23, 2011.
Extended European Search Report for Application No. 11006586.9; Oct. 12, 2011.

* cited by examiner

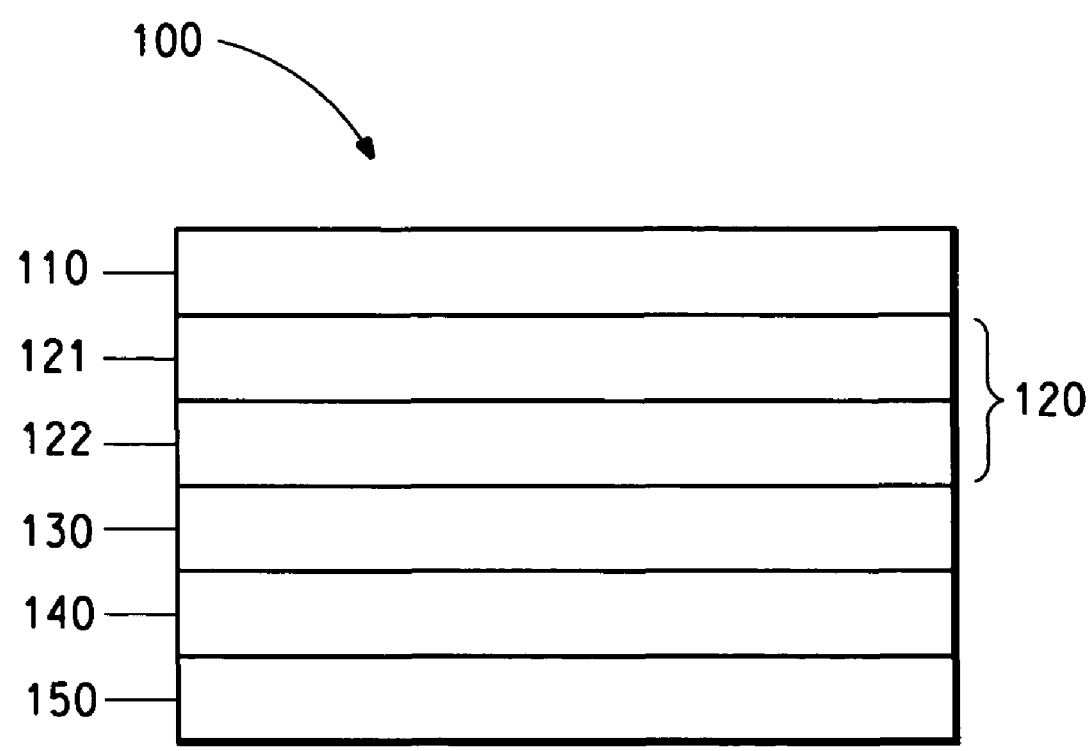

CONDUCTIVE POLYMER COMPOSITES

FIELD OF THE INVENTION

The invention relates to conductive polymer composites comprising a first layer comprising at least one electrically conductive polymer and a second layer comprising a material selected from a colloid-forming polymeric acid, a salt of a colloid-forming polymeric acid, a non-polymeric fluorinated organic acid, and a salt of a non-polymeric fluorinated organic acid.

BACKGROUND OF THE INVENTION

Electrically conducting polymers have been used in a variety of organic electronic devices, including in the development of electroluminescent ("EL") devices for use in light emissive displays. With respect to EL devices, such as organic light emitting diodes (OLEDs) containing conducting polymers, such devices generally have the following configuration:

anode/buffer layer/EL material/cathode

The anode is typically any material that is transparent and has the ability to inject holes into the EL material, such as, for example, indium/tin oxide (ITO). The anode is optionally supported on a glass or plastic substrate. EL materials include fluorescent dyes, fluorescent and phosphorescent metal complexes, conjugated polymers, and mixtures thereof. The cathode is typically any material (such as, e.g., Ca or Ba) that has the ability to inject electrons into the EL material.

The buffer layer is typically an electrically conducting polymer and facilitates the injection of holes from the anode into the EL material layer. The buffer layer can also be called a hole-injection layer, a hole transport layer. Typical conducting polymers employed as buffer layers include polyaniline ("PAni") and polydioxythiophenes such as poly(3,4-ethylenedioxythiophene) ("PEDT"). These materials can be prepared by polymerizing aniline or dioxythiophene monomers in aqueous solution in the presence of a water soluble polymeric acid, such as poly(styrenesulfonic acid) (PSSA), or poly(2-acrylamido-2-methyl-1-propanesulfonic acid) ("PMMPSA"), as described in, for example, U.S. Pat. No. 5,300,575 and published PCT application WO 02/065484. A well known PEDT/PSS material is Baytron®-P, commercially available from H. C. Starck, GmbH (Leverkusen, Germany).

There is a need for improved conductive polymer layers for electronic devices.

SUMMARY OF THE INVENTION

New composites are provided comprising a first layer comprising at least one doped conductive polymer and a second layer comprising a material selected from a colloid-forming polymeric acid, a salt of a colloid-forming polymeric acid, a non-polymeric fluorinated organic acid, and a salt of a non-polymeric fluorinated organic acid.

Methods are provided for preparing the new composites.

Electronic devices and applications comprising at least one layer comprising the new composite are provided.

The foregoing general description and the following detailed description are exemplary and explanatory only and are not restrictive of the invention, as defined in the appended claims.

BRIEF DESCRIPTION OF THE FIGURES

The invention is illustrated by way of example and not limited in the accompanying figures.

FIG. 1 illustrates a cross-sectional view of one example of one type of electronic device that comprises a buffer layer comprising the new composition.

DETAILED DESCRIPTION OF THE INVENTION

In one embodiment, composites are provided comprising a first layer comprising at least one conductive polymer and a second layer comprising a material selected from a colloid-forming polymeric acid, a salt of a colloid-forming polymeric acid, a non-polymeric fluorinated organic acid, and a salt of a non-polymeric fluorinated organic acid.

As used herein, the term "composite" refers to a structure made up of two or more layers. The term "layer" is used interchangeably with the term "film" and refers to a coating covering a desired area. The area can be as large as an entire device or as small as a specific functional area such as the actual visual display, or as small as a single sub-pixel. Films can be formed by any conventional deposition technique, including vapor deposition and liquid deposition. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing. As used herein, the term "colloid" refers to minute particles suspended in a continuous liquid medium, said particles having a nanometer-scale particle size. As used herein, the term "colloid-forming" refers to substances that form minute particles when dispersed in the liquid medium, i.e., "colloid-forming" polymeric acids are not soluble in the particular liquid medium used. As used herein, the term "fluorinated organic acid" refers to an organic compound having at least one acid group and at least one fluorine bonded to a carbon atom. The term encompasses partially fluorinated and perfluorinated materials.

The conductive polymers suitable for the first layer of the new composite can be homopolymers, or they can be co-polymers of two or more respective monomers. The composite may further comprise one or more different conductive polymers. In one embodiment, the conductive polymer is selected from polythiophenes, polypyrroles, polyanilines, and combinations thereof.

Polythiophenes contemplated for use in the new composite comprise Formula I below:

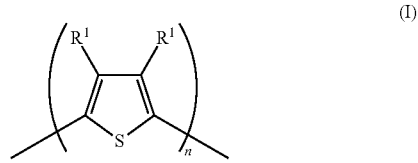

(I)

wherein:
R$^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and n is at least about 4.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

"alcohol" —$R^3$—OH

"amidosulfonate" —$R^3$—C(O)N($R^6$)$R^4$—SO$_3$Z

"benzyl" —CH$_2$—C$_6$H$_5$

"carboxylate" —$R^3$—C(O)O—Z

"ether" —$R^3$—O—$R^5$

"ether carboxylate" —$R^3$—O—$R^4$—C(O)O—Z

"ether sulfonate" —$R^3$—O—$R^4$—SO$_3$Z

"urethane" —$R^3$—O—C(O)—N($R^6$)$_2$ where all "R" groups are the same or different at each occurrence and:

$R^3$ is a single bond or an alkylene group $R^4$ is an alkylene group $R^5$ is an alkyl group $R^6$ is hydrogen or an alkyl group Z is H, alkali metal, alkaline earth metal, N($R^5$)$_4$ or $R^5$ Any of the above groups may further be unsubstituted or substituted, and any group may have fluorine substituted for one or more hydrogens, including perfluorinated groups.

In one embodiment, in the polythiophene both $R^1$ together form —O—(CHY)$_m$—O—, where m is 2 or 3, and Y is the same or different at each occurrence and is selected from hydrogen, alkyl, alcohol, amidosulfonate, benzyl, carboxylate, ether, ether carboxylate, amidosulfonate, ether sulfonate, and urethane. In one embodiment, all Y are hydrogen. In one embodiment, the polythiophene is poly(3,4-ethylenedioxythiophene). In one embodiment, at least one Y group is not hydrogen. In one embodiment, at least one Y group is a substituent having fluorine substituted for at least one hydrogen. In one embodiment, at least one Y group is perfluorinated.

Polypyrroles contemplated for use the new composite comprise Formula II below.

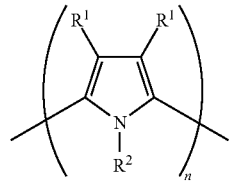

(II)

where in Formula II:

n is at least about 4;

$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, amidosulfonate, ether carboxylate, ether sulfonate, and urethane.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the polypyrrole is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, amidosulfonate, ether sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form —O—(CHY)$_m$—O—, where m is 2 or 3, and Y is the same or different at each occurrence and is selected from hydrogen, alkyl, alcohol, benzyl, carboxylate, ether, ether carboxylate, amidosulfonate, ether sulfonate, and urethane. In one embodiment, at least one Y group is not hydrogen. In one embodiment, at least one Y group is a substituent having fluorine substituted for at least one hydrogen. In one embodiment, at least one Y group is perfluorinated.

Polyanilines contemplated for use in the new composite comprise Formula III or Formula IV below.

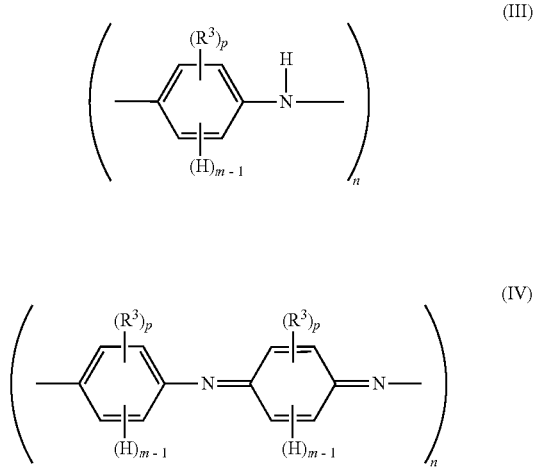

wherein:
n is at least about 4;
p is an integer from 0 to 4;
m is an integer from 1 to 5, with the proviso that p+m=5; and
$R^3$ is independently selected so as to be the same or different at each occurrence and is selected from alkyl, alkenyl, alkoxy, cycloalkyl, cycloalkenyl, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two $R^3$ groups together may form an alkylene or alkenylene chain completing a 3, 4, 5, 6, or 7-membered aromatic or alicyclic ring, which ring may optionally include one or more divalent nitrogen, sulfur or oxygen atoms.

In one embodiment, the polyaniline is unsubstituted and p=0.

The synthesis of thiophene, pyrrole, and aniline polymers is well known and has been extensively described. Polymerization of thiophene monomers has been described in, for example, U.S. Pat. No. 5,300,575. Polymerization of aniline monomers has been described in, for example, U.S. Pat. No. 5,798,170.

In one embodiment, the conductive polymer is made by oxidative polymerization of the monomer or monomers to form the conductive polymer, in the presence of a soluble acid. The acid can be a polymeric or non-polymeric acid. The polymerization is generally carried out in a homogeneous solution. In one embodiment, the polymerization is carried out in a homogeneous aqueous solution. In another embodiment, the polymerization for obtaining the electrically conducting polymer is carried out in an emulsion of water and an organic solvent. In general, some water is present in order to obtain adequate solubility of the oxidizing agent and/or catalyst. Oxidizing agents such as ammonium persulfate, sodium persulfate, potassium persulfate, and the like, can be used. A catalyst, such as ferric chloride, or ferric sulfate may also be present. The resulting polymerized product will be a solution, dispersion, or emulsion of the doped conductive polymer. Aqueous dispersions of polypyrrole and a non-polymeric organic acid anion are available commercially from Sigma-Aldrich (St. Louis, Mo.). Aqueous dispersions of poly(2,3-ethylendioxythiophene)/PSSA are available commercially from H.C. Starck, GmbH. (Leverkusen, Germany). Aqueous and non-aqueous dispersions of doped polyaniline, and doped polyaniline solids are available commercially from Covion Organic Semiconductors GmbH (Frankfurt, Germany) or Ormecon (Ambersbek, Germany).

The electrically conductive polymers are doped with at least one anion. As used herein, the term "doped" refers to the formation of an ion pair wherein the negative charge on an anion balances the positive charge on a conductive polymer. The anion is referred to as a "dopant".

The polythiophene and polypyrrole polymers formed by oxidative polymerization are positively charged. In the conductive form of polyaniline at least some of the nitrogens are protonated, so that it also is positively charged. The positive charges are balanced by the negative charge of the dopant. In one embodiment the dopant is an organic anion. In one embodiment, the dopant is an organic acid anion. The organic acid can be polymeric or non-polymeric. The acids are selected to be soluble in the polymerization medium for the conductive polymer, and accordingly, can be water-soluble or organic solvent soluble. The acid anions can be selected from sulfonates, carboxylates, phosphates, phosphonates, acrylates, and mixtures thereof. In one embodiment, the acid is a sulfonic acid. In one embodiment, the acid is a water-soluble acid or organic-soluble acid selected from a non-polymeric organic acid, a water soluble polymeric acid, and combinations thereof.

Examples of polymeric organic acids include, but are not limited to, poly(styrenesulfonic acid) (PSSA), and poly(2-acrylamido-2-methyl-1-propanesulfonic acid) ("PM-MPSA"). The corresponding acid anions are the sulfonates, "PSS" and "PMMPS". Examples of suitable non-polymeric acids include, but are not limited to, acetic acid, p-toluenesulfonic acid, camphorsulfonic acid, p-dodecylbenzenesulfonic acid, methanesulfonic acid, trifluoromethanesulfonic acid, and the like. The corresponding acid anions are acetate, p-toluenesulfonate, camphorsulfonate, p-dodecylbenzenesulfonate, methanesulfonate, and trifluoromethanesulfonate. Mixtures of acid anions can be used.

The combination of the positively charged conductive polymer and the anion will be hereinafter referred to as the "doped conductive polymer."

In one embodiment, the second layer of the new composite comprises a colloid-forming polymeric acid or a salt of the acid, referred to collectively hereinafter as the "colloid-forming polymeric acid/salt". The salt can be formed from the acid by known methods, such as the addition of alkali or ammonium hydroxide. The colloid-forming polymeric acid/salt will be described below in terms of the acid, but is not limited thereto.

Colloid-forming polymeric acid/salts contemplated for use in the second layer of the new composites are insoluble in the liquid medium, and form colloids when dispersed into the liquid medium. The polymeric acids typically have a molecular weight in the range of about 10,000 to about 4,000,000.

In one embodiment, the polymeric acids have a molecular weight of about 100,000 to about 2,000,000. Polymeric acid colloid particle size typically ranges from about 2 nanometers (nm) to about 140 nm. In one embodiment, the colloids have a particle size of about 2 nm to about 30 nm.

Any polymeric acid that is colloid-forming when dispersed in the liquid medium is suitable for use to make the new composites. In one embodiment, the colloid-forming polymeric acid comprises at least one polymeric acid selected form polymeric sulfonic acid, polymeric phosphoric acids, polymeric phosphonic acids, polymeric carboxylic acids, and polymeric acrylic acids, and mixtures thereof. In another embodiment, the polymeric sulfonic acid is fluorinated. In still another embodiment, the colloid-forming polymeric sulfonic acid is perfluorinated. In yet another embodiment, the colloid-forming polymeric sulfonic acid comprises a perfluoroalkylenesulfonic acid.

In still another embodiment, the colloid-forming polymeric acid comprises a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula —SO$_3$X where X is a cation, also known as a "counterion". X may be H, Li, Na, K or N($R_1$)($R_2$)($R_3$)($R_4$), and $R_1$, $R_2$, $R_3$, and $R_4$ are the same or different and are and in one embodiment H, CH$_3$ or C$_2$H$_5$. In another embodiment, X is H, in which case the polymer is said to be in the "acid form". X may also be multivalent, as represented by such ions as Ca$^{++}$, and Al$^{+++}$. It is clear to the skilled artisan that in the case of multivalent counterions, represented generally as Mn$^+$, the number of sulfonate functional groups per counterion will be equal to the valence "n".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group (—SO$_2$F), which can be subsequently hydrolyzed to a sulfonate functional group. For example, copolymers of a first fluorinated vinyl monomer together with a second fluorinated vinyl monomer having a sulfonyl fluoride group (—SO$_2$F) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, one other monomer includes fluorinated vinyl ethers with sulfonate functional groups or precursor groups which can provide the desired side chain in the polymer. Additional monomers, including ethylene, propylene, and R—CH=CH$_2$ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the co-monomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for use in the new composite include a highly fluorinated, and in one embodiment perfluorinated, carbon backbone and side chains represented by the formula

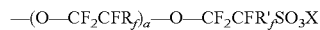

wherein Rf and R'f are independently selected from F, Cl or a perfluorinated alkyl group having 1 to 10 carbon atoms, a=0, 1 or 2, and X is H, Li, Na, K or N(R1)(R2)(R3)(R4) and R1, R2, R3, and R4 are the same or different and are and in one embodiment H, CH$_3$ or C$_2$H$_5$. In another embodiment X is H. As stated above, X may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

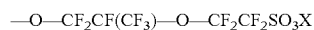

where X is as defined above. FSA polymers of this type are disclosed in U.S. Pat. No. 3,282,875 and can be made by copolymerization of tetrafluoroethylene (TFE) and the perfluorinated vinyl ether CF$_2$=CF—O—CF$_2$CF(CF$_3$)—O—CF$_2$CF$_2$SO$_2$F, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—CF$_2$CF$_2$SO$_3$X, wherein X is as defined above. This polymer can be made by copolymerization of tetrafluoroethylene (TFE) and the perfluorinated vinyl ether CF$_2$=CF—O—CF$_2$CF$_2$SO$_2$F, perfluoro(3-oxa-4-pentenesulfonyl fluoride) (POPF), followed by hydrolysis and further ion exchange as necessary.

In one embodiment, the FSA polymers for use in the new composite typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—CF$_2$—CF(CF$_3$)—O—CF$_2$—CF$_2$—SO$_3$H (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —O—CF$_2$CF$_2$SO$_3$H (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The synthesis of FSA polymers is well known. The FSA polymers can be prepared as colloidal aqueous dispersions. They may also be in the form of dispersions in other media, examples of which include, but are not limited to, alcohol, water miscible liquids, such as tetrahydrofuran, mixtures of water-soluble ethers, and combinations thereof. In making the new composites, the polymer can be used in acid form. In one embodiment, the water in the aqueous FSA dispersions is removed prior to or after combination with the conductive polymers. U.S. Pat. Nos. 4,433,082, 6,150,426 and WO 03/006537 disclose methods for making of aqueous dispersions. After the dispersion is made, the concentration and the dispersing liquid composition can be adjusted by methods known in the art.

In one embodiment, aqueous dispersions of the colloid-forming polymeric acids, including FSA polymers, have particle sizes as small as possible and an EW as small as possible, so long as a stable colloid is formed.

Aqueous dispersions and non-aqueous dispersions of FSA polymer, are available commercially under the trademark Nafion® from E. I. du Pont de Nemours and Company (Wilmington, Del.). Dispersible solids of FSA polymer can be prepared from aqueous or non-aqueous dispersions, by removing the liquid medium at a temperature less than the coalescence temperature of the FSA compositions, as described in U.S. Pat. No. 6,150,426. By "coalescence temperature" is meant the temperature at which a dried solid of the FSA polymer is cured to a stable solid which is not redispersible in water or other polar solvent. A typical coalescence temperature can be about 175° C. Methods of removing the liquid medium include, but are not limited to, heating to a temperature less than about 100° C., freeze-drying, and spray drying.

In one embodiment, the second layer of the new composite comprises a non-polymeric fluorinated organic acid or a salt of the acid, referred to collectively hereinafter as the "non-polymeric fluorinated organic acid/salt". The salt can be formed from the acid by known methods, such as the addition of alkali or ammonium hydroxide. The non-polymeric fluorinated organic acid/salt will be described below in terms of the acid, but is not limited thereto.

Non-polymeric fluorinated organic acid/salts contemplated for use in the second layer of the new composites can be soluble or dispersible in aqueous or non-aqueous liquid media. In one embodiment, the non-polymeric fluorinated organic acid is selected from non-polymeric fluorinated sulfonic acids, non-polymeric fluorinated phosphoric acids, non-polymeric fluorinated phosphonic acids, non-polymeric fluorinated carboxylic acids, non-polymeric fluorinated acrylic acids, and mixtures thereof. In one embodiment, the non-polymeric fluorinated organic acid is highly fluorinated. The term "highly fluorinated" is intended to mean that at least 50% of the hydrogens attached to carbon atoms have been replaced by fluorine. In one embodiment, the non-polymeric fluorinated organic acid is perfluorinated. In one embodiment, the non-polymeric fluorinated organic acid is a fluoroether organic acid, fluoroamido organic acid, or fluoroamidoether organic acid. In one embodiment, the non-polymeric fluorinated organic acid is perfluorinated.

As used herein, the following terms refer to the formulae given below:

| ether organic acid | $R^5\text{—}O\text{—}R^4\text{—}Q$ |
|---|---|
| amido organic acid | $R^5\text{—}C(O)N(R^6)\,R^4\text{—}Q$ |
| amidoether organic acid | $R^5\text{—}C(O)N(R^6)\,R^4\text{—}O\text{—}R^4\text{—}Q$ | where $R^4$, $R^5$, and $R^6$ are as defined above, and Q is an acid group or an acid salt group. As used herein, the prefix "fluoro" is intended to mean that at least one hydrogen has been replaced by a fluorine. The term includes partially fluorinated and perfluorinated. In one embodiment, Q is selected from —$SO_3Z$, —$CO_2Z$, —$PO_3Z$, where Z is as defined above.

In one embodiment, the non-polymeric organic acid/salt is a fluoroethersulfonic acid/salt having Formula V:

$$R^7\text{—}(O\text{—}CF_2CFR_f)_a\text{—}O\text{—}CF_2CFR'_fSO_3X \qquad (V)$$

wherein $R^7$ is a fluoroalkyl group, Rf and R'f are independently selected from F, Cl or a perfluorinated alkyl group having 1 to 10 carbon atoms, a=0, 1 or 2, and X is selected from $H^+$, metal cations, and $N(R1)(R2)(R3)(R4)^+$ where R1, R2, R3, and R4 are the same or different and are selected from H and alkyl. In one embodiment, R1, R2, R3, and R4 are selected from $CH_3$ and $C_2H_5$. In another embodiment X is $H^+$. As stated above, X may also be multivalent. In one embodiment, $R^7$ is a perfluorinated alkyl group. In one embodiment, $R^7$ is selected from difluoromethyl and 1,1,2,2-tetrafluoroethyl.

Examples of fluoroethersulfonic acids having Formula V include, but are not limited to 2-(1,1,2,3,3,3-hexafluoro-1-(perfluoroethoxy)propane-2-yloxy)-1,1,2,2-tetrafluoroethanesulfonic acid, 1,1,2,2-tetrafluoro-2-(perfluoroethoxy) ethanesulfonic acid, and 2-(1,1,2,2-tetrafluoroethoxy)-1,1,2,2-tetrafluoroethanesulfonic acid.

The fluoroethersulfonic acids can be made from the corresponding sulfonyl fluoride by hydrolyzing to form the sulfonic acid. The sulfonyl fluoride can be prepared according to known synthetic procedures. The acids can also converted to alkali metal salts.

In one embodiment of the new composite, the first layer is directly adjacent the second layer so that at least a portion of the first layer is in physical contact with at least a portion of the second layer. In one embodiment, one or more additional layers are interposed between the first layer and the second layer.

The first layer can be formed using any known liquid deposition technique, as discussed above. In one embodiment, the first layer is formed by liquid deposition from an aqueous liquid medium. Most conductive polymers can be readily formed or are available commercially as aqueous dispersions.

As used herein, the term "liquid medium" refers to a pure liquid, a mixture of liquids, liquid solution, a liquid dispersion, or a liquid emulsion. As used herein, the term "dispersion" refers to a liquid containing a suspension of minute particles. The liquid can be aqueous or non-aqueous. As used herein, the term "aqueous" refers to a liquid medium in which water forms a significant portion of the liquid, and the term "non-aqueous" refers to a liquid medium in which an organic liquid forms a significant portion of the liquid. In one embodiment, an aqueous liquid medium contains greater than about 40% by weight water based on the total weight of liquid, and a non-aqueous liquid medium contains at least about 60% by weight organic liquid, based on the total weight of liquid. The organic liquid may include one or more organic compounds.

In one embodiment, the first layer is formed by liquid deposition from a non-aqueous liquid medium. A non-aqueous dispersion of conductive polymer can be obtained by dispersing doped conductive polymer solids in a non-aqueous liquid medium. Doped conductive polymer solids can be obtained from a solution, dispersion or emulsion of doped conductive polymer by any conventional technique. Such techniques include, but are not limited to evaporative drying, spray drying, flash drying, centrifugation, precipitation by a non-solvent followed by filtration, freeze-drying, and the like. In one embodiment, the solids are only partially dried to facilitate dispersion in an organic liquid. Examples of suitable organic liquids include, but are not limited to, ethers, cyclic ethers, alcohols, polyols, alcohol ethers, ketones, nitriles, sulfides, sulfoxides, amides, amines, carboxylic acids, and the like, as well as combinations of any two or more thereof. In one embodiment, the organic liquid is selected from dimethylacetamide ("DMAc"), N-methylpyrrolidone ("NMP"), dimethylformamide ("DMF"), ethylene glycol ("EG"), aliphatic alcohols, and mixtures thereof.

In one embodiment, prior to forming the first layer, the conductive polymer in a liquid medium is contacted with at least one ion exchange resin under conditions suitable to remove decomposed species, side reaction products, unreacted monomers, and ionic impurities, and to adjust pH. The ion exchange treatment can be carried out at any point after polymerization of the conductive polymer. The conductive polymer dispersion can be contacted with at least one ion exchange resin before or after the addition of a co-dispersing liquid. In one embodiment, the conductive polymer in a liquid medium is contacted with a first ion exchange resin and a second ion exchange resin.

In another embodiment, the first ion exchange resin is an acidic, cation exchange resin, such as a sulfonic acid cation exchange resin set forth above, and the second ion exchange resin is a basic, anion exchange resin, such as a tertiary amine or a quaternary exchange resin.

Ion exchange is a reversible chemical reaction wherein an ion in a fluid medium (such as a non-aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as acidic, cation exchangers, which have positively charged mobile ions available for exchange, and basic, anion exchangers, whose exchangeable ions are negatively charged.

Both acidic, cation exchange resins and basic, anion exchange resins are contemplated for use in the new process. In one embodiment, the acidic, cation exchange resin is an organic acid, cation exchange resin, such as a sulfonic acid cation exchange resin. Sulfonic acid cation exchange resins contemplated for use in the new composition include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphoric acid cation exchange resin. In addition, mixtures of different cation exchange resins can be used. In many cases, the basic ion exchange resin can be used to adjust the pH to the desired level. In some cases, the pH can be further adjusted with an aqueous basic solution such as a solution of sodium hydroxide, ammonium hydroxide, or the like.

In another embodiment, the basic, anionic exchange resin is a tertiary amine anion exchange resin. Tertiary amine anion exchange resins contemplated for use in the new compositions include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the conductive polymer in a liquid medium either simultaneously, or consecutively. For example, in one embodiment both resins are added simultaneously to a conductive polymer dispersion, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. The basic, anion exchange and/or acidic, cation exchange resins renders the acidic sites more basic, resulting in increased pH of the dispersion. In general, at least 1 gram of ion exchange is used per about 1 gram of doped conductive polymer solids, for example, PEDT/PSSA. In other embodiments, the use of the ion exchange resin is used in a ratio of up to about 5 grams of ion exchange resin to doped conductive polymer solids, and depends on the pH that is to be achieved. In one embodiment, about one gram of Lewatit® MP62 WS, a weakly basic anion exchange resin from Bayer GmbH, and about one gram of Lewatit® MonoPlus S100, a strongly acidic, sodium cation exchange resin from Bayer, GmbH, are used per gram of doped conductive polymer solids.

In another embodiment, a first layer having a higher conductivity can be formed by the addition of highly conductive additives to the liquid medium containing the conductive polymer. In one embodiment, the liquid medium containing the conductive polymer can have a relatively high pH.

The second layer of the composite comprises a material selected from a colloid-forming polymeric acid/salt and a non-polymeric fluorinated organic acid/salt, hereinafter collectively referred to as the "Acid/Salt". The second layer can be formed by any known deposition technique, as discussed above. In some cases, non-polymeric fluorinated organic acids having low molecular weights, can be deposited by vapor deposition techniques. In one embodiment, the second layer is formed by liquid deposition from an aqueous liquid medium. In one embodiment, the second layer is formed by liquid deposition from a non-aqueous liquid medium. A non-aqueous dispersion or solution of The Acid/Salt can be obtained by dispersing the solids in a non-aqueous liquid medium. The solids can be obtained as discussed above with respect to the doped conductive polymer. Examples of suitable organic liquids include those discussed above for the doped conductive polymer.

In one embodiment, prior to forming the second layer, the Acid/Salt in a liquid medium is contacted with a basic ion exchange resin in order to increase the pH to a desired level. In some cases, the pH can be further adjusted with the addition of a basic material, such as sodium hydroxide, ammonium hydroxide, or the like.

In one embodiment, the new composites form a buffer layer in an electronic device. The term "buffer layer" as used herein, is intended to mean an electrically conductive or semi-conductive layer which can be used between an anode and an active organic material. A buffer layer is believed to accomplish one or more function in an organic electronic device, including, but not limited to planarization of the underlying layer, hole transport, hole injection, scavenging of impurities, such as oxygen and metal ions, among other aspects to facilitate or to improve the performance of an organic electronic device.

In one embodiment, there are provided buffer layer comprising the new composite, wherein the first layer comprises a conductive polymer selected from polythiophenes, polypyrroles, polyanilines, and combinations thereof. In one embodiment of the buffer layer, the second layer comprises at least one non-polymeric fluorinated organic acid/salt having Formula V, described above. In one embodiment of the buffer layer, the second layer comprises a colloid-forming polymeric sulfonic acid/salt. In one embodiment of the buffer layer, the second layer comprises a colloid-forming fluorinated polymeric sulfonic acid. In still another embodiment of the buffer layer comprising the new composite further comprises a polymeric perfluoroethylenesulfonic acid in the layer.

In one embodiment, the organic electronic device comprises an electroactive layer positioned between two electrical contact layers, wherein the device includes the new composite. One embodiment is illustrated in one type of OLED device, as shown in FIG. 1, which is a device that has anode layer 110, a buffer layer 120, an electroluminescent layer 130, and a cathode layer 150. The buffer layer 120 is a layer having a first layer 121 and a second layer 122. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline, polythiophene, or polypyrrole. The IUPAC number system is used throughout, where the groups from the Periodic Table are numbered from left to right as 1-18 (CRC Handbook of Chemistry and Physics, 81$^{st}$ Edition, 2000).

The anode layer 110 may be formed by a chemical or physical vapor deposition process or spin-coating process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

The anode layer 110 may be patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

In the buffer layer 120, the first layer 121 comprises a doped conductive polymer. The second layer 122 comprises a material selected from a colloid-forming polymeric acid/salt and a non-polymeric fluorinated organic acid/salt. The layers can be formed using any deposition technique well-known to those skilled in the art, as discussed above.

The electroluminescent ("EL") layer 130 may typically be any organic EL material, including, but not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

The particular material chosen may depend on the specific application, potentials used during operation, or other factors. The EL layer 130 containing the electroluminescent organic material can be applied using any number of techniques including vapor deposition, solution processing techniques or thermal transfer. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal-chelated oxinoid compounds (e.g., Alq$_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130, or between the first layer 121 and the second layer 122 of the buffer layer, may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. In one embodiment, inorganic anode layer 110 is usually no greater than approximately 500 nm, for example, approximately 10-200 nm; buffer layer 120, is usually no greater than approximately 250 nm. The second layer of the buffer layer is usually much less than 50 nm. In one embodiment, the second layer is less than 10 nm. EL layer 130, is usually no greater than approximately 100 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm.

In organic light emitting diodes (OLEDs), electrons and holes, injected from the cathode 150 and anode 110 layers, respectively, into the EL layer 130, form negative and positively charged polar ions in the polymer. These polar ions migrate under the influence of the applied electric field, forming a polar ion exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

In one embodiment a high pH composition is used to form at least one of the layers in the buffer layer of an electronic device. In one OLED embodiment, the pH is adjusted so as to reduce etching of the ITO layer during device fabrication and hence much lower concentration of In and Sn ions diffusing into the polymer layers of the OLED. Since In and Sn ions are suspected to contribute to reduced operating lifetime this is a significant benefit. The lower acidity also reduces corrosion of the metal components of the display (e.g. electrical contact pads) during fabrication and over the long-term storage. PEDT/PSSA residues will interact with residual moisture to release acid into the displays with resulting slow corrosion.

In one embodiment there are provided electronic devices comprising at least one electrically conductive or semiconductive layer comprising the new composition. Organic electronic devices that may benefit from having one or more layers comprising the composition of at least one polythiophene having Formula I(a) or Formula I(b), and at least one colloid-forming polymeric acids and include, but are not limited to, (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode). Other uses for the new compositions include coating materials for memory storage devices, antistatic films, biosensors, electrochromic devices, solid electrolyte capacitors, energy storage devices such as a rechargeable battery, and electromagnetic shielding applications.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The new composites and their uses will now be described in greater detail by reference to the following non-limiting examples.

EXAMPLES

Example 1

This example will illustrate preparation of uncoalesced solids of perfluoroethylenesulfonic acid (FSA) dispersions available commercially under the trademark Nafion® from E. I. du Pont de Nemours and Company (Wilmington, Del.).

The following commercial Nafion® dispersions will be used for preparation of uncoalesced solids: DE520 and DE521 (both ~5.0% FSA in 48% n-propanol/~45% water), DE1021 and DE1020 (both ~10% FSA in ~90% water) and the FSA dispersions made using a procedure similar to the procedure in U.S. Pat. No. 6,150,426, Example 1, Part 2, except that the temperature is approximately 270° C. The solids will be obtained by freeze drying 100° C.

Example 2

This example will illustrate the performance of a device having a buffer layer with a first layer made from a commercial aqueous poly(dioxyethylenethiophene), PEDT, dispersion and a second layer made from a Nafion® dispersion (referred to in the remaining examples as the PEDT/Nafion® buffer layer).

In this example, Baytron-P5 Al4083 will be used to form the first layer of a buffer layer. Al4083 is PEDT/PSSA from H. C. Starck, GmbH, Leverkusen, Germany. The dispersion has a pH of ~1.8 and the w/w ratio between PEDT/PSSA is 1:6. The dispersion will be spin-coated onto an ITO substrate. The dried layer will be then top-coated with a diluted dispersion of Nafion® in a selected liquid which will not attack the PEDT/PSSA layer, to form the second layer of the buffer layer. The Nafion® layer thickness will be smaller than 10 nm. The PEDT/Nafione buffer layer will then be spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with PEDT but without the Nafione second layer.

Example 3

This example will illustrate the performance of a device with a PEDT/Nafion® buffer layer, where the pH of the dispersion used to form the first layer is adjusted to 4.

In this example, a Baytron-P® Al4083 dispersion will be treated with base to achieve a pH of 4 prior to spin-coating onto an ITO substrate. The dried layer will be then top-coated with a diluted dispersion of Nafion® in a selected liquid, which will not attack the PEDT layer, to form the second layer of the buffer layer. The Nafione layer thickness will be smaller than 10 nm. The PEDT/Nafion® layer will then be spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with PEDT but without the Nafion® second layer.

Example 4

This example will illustrate the performance of a device with using a PEDT/Nafion® buffer layer, where the Nafion® layer contains alkali hydroxide.

In this example, alkali hydroxide will be added to a Nafion® dispersion to form the alkali salt of the Nafion® sulfonic acid groups. This treated Nafion® dispersion will be spin-coating onto a dried layer of PEDT/PSSA onto an ITO substrate, as described in Example 2. The PEDT/Nafion® layer will then be spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with PEDT but without the Nafion® second layer.

Example 5

This example will illustrate the performance of a device having a buffer layer with a first layer made from a Baytron-P Al4083 dispersion and a second layer comprising a non-polymeric fluoroethersulfonic acid.

In this example, one of three non-polymeric fluoroethersulfonic acids, or their alkali salts, will be used to form a buffer layer with a dried layer of PEDT/PSSA on an ITO substrate, as described in Example 2. The three non-polymeric fluoroethersulfonic acids are:
1) 2-(1,1,2,3,3,3-hexafluoro-1-(perfluoroethoxy)propane-2-yloxy)-1,1,2,2-tetrafluoroethanesulfonic acid and its salts;
2) 1,1,2,2-tetrafluoro-2-(perfluoroethoxy)ethanesulfonic acid and its salts;
3) 2-(1,1,2,2-tetrafluoroethoxy)-1,1,2,2-tetrafluoroethanesulfonic acids and its salts.

The non-polymeric will be made into solutions and spin-coated onto the PEDT/PSSA layer on ITO.

The buffer layer will then be spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made PEDT but without the non-polymeric fluoroethersulfonate second layer.

Example 6

This example will illustrate the performance of a device made with a buffer layer of PEDT and the alkali salt of a non-polymeric fluoroethersulfonic acid, where the non-polymeric fluoroethersulfonic acid salt is vapor-deposited.

In this example, the alkali salt of one of three non-polymeric fluoroethersulfonic acids described in Example 5 will be vapor-deposited on a dried layer of PEDT/PSSA on an ITO substrate, as described in Example 2.

The buffer layer will then be spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with PEDT but without the non-polymeric fluoroethersulfonate second layer.

Example 7

This example will illustrate the performance of a device made using a commercial aqueous polypyrrole dispersion and a Nafion® dispersion to form a buffer layer.

A commercial aqueous polypyrrole composition (5%, w/w) from Aldrich (2003-2004 Cat # 48,255-2) is a conductive polypyrrole doped with an organic acid. This will be diluted with deionized water down to 2.5% w/w. The dilution will be necessary to obtain a viscosity, which will allow the use of reasonable spin rates (<5,000 RPM).

The diluted dispersion of polypyrrole will be spin-coated onto an ITO substrate to form the first layer of a buffer layer. The dried layer will be the top-coated with a diluted dispersion of Nafion® in a selected liquid, which will not attack the polypyrrole layer, to form the second layer of the buffer layer. The Nafion® layer thickness will be smaller than 10 nm. The polypyrrole/Nafion® layer will then be spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with polypyrrole but without the Nafion® second layer.

What is claimed is:

1. An electronic device comprising an anode, a buffer layer, and an active organic material layer, wherein the buffer layer is a composite comprising a first layer comprising at least one doped conductive polymer and a second layer comprising a material selected from a colloid-forming polymeric acid, a salt of a colloid-forming polymeric acid, a non-polymeric fluorinated organic acid, and a salt of a non-polymeric fluorinated organic acid, wherein the composition of the first layer and the second layer is different, and further wherein at least one additional layer is interposed between the first layer and the second layer.

2. An electronic device according to claim 1, wherein the conductive polymer is selected from polythiophenes, polypyrroles, polyanilines, and combinations thereof.

3. An electronic device according to claim 2, wherein the polythiophene comprises Formula I:

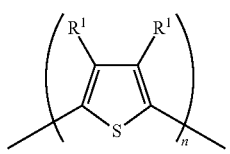

wherein:
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and n is at least about 4.

4. An electronic device according to claim 2, wherein the polypyrrole comprises Formula II:

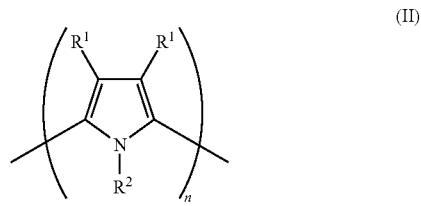

wherein:
n is at least about 4;
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and
$R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, and urethane.

5. An electronic device according to claim 2, wherein the polyaniline comprises Formula III or Formula IV:

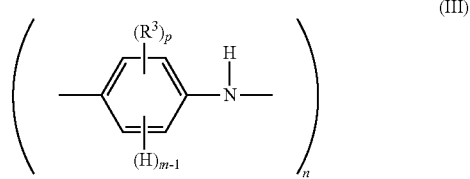

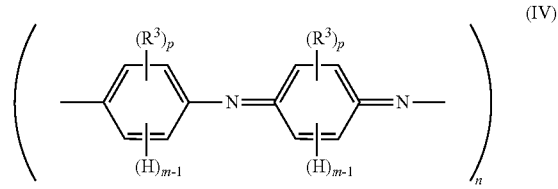

wherein:

n is at least about 4;

p is an integer from 0 to 4;

m is an integer from 1 to 5, with the proviso that p+m=5; and $R^3$ is independently selected so as to be the same or different at each occurrence and is selected from alkyl, alkenyl, alkoxy, cycloalkyl, cycloalkenyl, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two $R^3$ groups together may form an alkylene or alkenylene chain completing a 3, 4, 5, 6, or 7-membered aromatic or alicyclic ring, which ring may optionally include one or more divalent nitrogen, sulfur or oxygen atoms.

6. An electronic device according to claim 1, wherein said colloid-forming polymeric acid is selected from polymeric sulfonic acids, polymeric phosphoric acids, polymeric phosphonic acids, polymeric carboxylic acids, polymeric acrylic acids, and mixtures thereof.

7. An electronic device according to claim 6, wherein said colloid-forming polymeric acid comprises a fluorinated polymeric sulfonic acid.

8. An electronic device according to claim 7, wherein said polymeric sulfonic acid is perfluorinated.

9. An electronic device according to claim 1, wherein said non-polymeric fluorinated organic acid is selected from non-polymeric fluorinated sulfonic acids, non-polymeric fluorinated phosphoric acids, non-polymeric fluorinated phosphonic acids, non-polymeric fluorinated carboxylic acids, non-polymeric fluorinated acrylic acids, and mixtures thereof.

10. An electronic device according to claim 9, wherein said non-polymeric fluorinated organic acid is highly fluorinated.

11. An electronic device according to claim 9, wherein said non-polymeric organic acid is perfluorinated.

12. An electronic device according to claim 9, wherein said second layer comprises a fluoroether sulfonate having Formula V:

$$R^7-(O-CF_2CFR_f)_a-O-CF_2CFR'_fSO_3X \qquad (V)$$

wherein $R^7$ is a fluoroalkyl group, $R_f$ and $R'_f$ are independently selected from F, Cl or a perfluorinated alkyl group having 1 to 10 carbon atoms, a=0, 1 or 2, and X is selected from $H^+$, metal cations, and $N(R1)(R2)(R3)(R4)^+$ where R1, R2, R3, and R4 are the same or different and are selected from H and alkyl.

13. An electronic device according to claim 12, wherein $R^7$ is selected from difluoromethyl and 1,1,2,2-tetrafluoroethyl.

14. An electronic device according to claim 12, wherein the second layer comprises a material selected from a non-polymeric fluorosulfonic acid and a salt of the fluorosulfonic acid, wherein the fluorosulfonic acid is selected from 2-(1,1,2,3,3,3-hexafluoro-1-(perfluoroethoxy)propane-2-yloxy)-1,1,2,2-tetrafluoroethanesulfonic acid, 1,1,2,2-tetrafluoro-2-(perfluoroethoxy)ethanesulfonic acid, and 2-(1,1,2,2-tetrafluoroethoxy)-1,1,2,2-tetrafluoroethanesulfonic acid.

15. An electronic device according to claim 1, wherein said non-polymeric fluorinated organic acid is selected from fluoroamido organic acids, fluoroamidoether organic acids, fluoroether organic acids, and combinations thereof.

16. An organic light-emitting diode comprising an anode, a buffer layer, an electroluminescent layer, and a cathode, wherein the buffer layer is a composite comprising a first layer comprising at least one doped conductive polymer and a second layer comprising a material selected from a colloid-forming polymeric acid, a salt of a colloid-forming polymeric acid, a non-polymeric fluorinated organic acid, and a salt of a non-polymeric fluorinated organic acid, wherein the composition of the first layer and the second layer is different, and further wherein at least one additional layer is interposed between the first layer and the second layer.

\* \* \* \* \*